United States Patent
Lin

(10) Patent No.: US 10,573,618 B1
(45) Date of Patent: Feb. 25, 2020

(54) PACKAGE STRUCTURES AND METHODS FOR FABRICATING THE SAME

(71) Applicant: Delta Electronics, Inc., Taoyuan (TW)

(72) Inventor: Shiau-Shi Lin, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 16/050,428

(22) Filed: Jul. 31, 2018

(51) Int. Cl.
| | |
|---|---|
| *H01L 23/373* | (2006.01) |
| *H01L 23/00* | (2006.01) |
| *H01L 23/522* | (2006.01) |
| *H01L 23/367* | (2006.01) |
| *H01L 21/768* | (2006.01) |

(52) U.S. Cl.
CPC ........ *H01L 24/33* (2013.01); *H01L 21/76816* (2013.01); *H01L 23/367* (2013.01); *H01L 23/3736* (2013.01); *H01L 23/5226* (2013.01); H01L 2224/02373 (2013.01)

(58) Field of Classification Search
CPC ............... H01L 24/33; H01L 21/76816; H01L 23/3736; H01L 23/367
See application file for complete search history.

(56) References Cited

U.S. PATENT DOCUMENTS

| | | | |
|---|---|---|---|
| 9,735,078 B2 | 8/2017 | Otremba et al. | |
| 2005/0199998 A1* | 9/2005 | Chen | H01L 23/16 |
| | | | 257/706 |
| 2012/0061700 A1 | 3/2012 | Eder et al. | |
| 2013/0284638 A1* | 10/2013 | Hsiao | B65D 81/057 |
| | | | 206/722 |
| 2016/0190059 A1* | 6/2016 | Tseng | H01L 23/528 |
| | | | 257/774 |
| 2016/0284638 A1* | 9/2016 | Tan | H01L 24/16 |

FOREIGN PATENT DOCUMENTS

TW    201826466 A    7/2018

OTHER PUBLICATIONS

An Office Action in corresponding TW Application No. 107135382 dated Apr. 15, 2019 is attached without English Translation.

\* cited by examiner

*Primary Examiner* — Dung A. Le
(74) *Attorney, Agent, or Firm* — Muncy, Geissler, Olds & Lowe, PC

(57) ABSTRACT

A package structure includes a metal carrier, a conductive adhesive layer disposed on the metal carrier, a conductive post disposed on the conductive adhesive layer, a semiconductor chip disposed on the conductive adhesive layer and laterally spaced from the conductive post, and a redistribution layer disposed on the conductive post and the semiconductor chip. The semiconductor chip includes a first terminal at an upper surface of the semiconductor chip. The first terminal of the semiconductor chip is electrically connected to the bottom surface of the semiconductor chip through the redistribution layer, the conductive post and the conductive adhesive layer.

18 Claims, 9 Drawing Sheets

PACKAGE STRUCTURES AND METHODS FOR FABRICATING THE SAME

BACKGROUND

Technical Field

The disclosure relates to package structures, and more particularly, to semiconductor chip packaging.

Description of the Related Art

Integrated circuit (IC) assemblies for complex electronic systems typically have a large number of interconnected IC chips or dies. Integrated circuit chips are being fabricated with increasingly smaller sizes and higher circuit densities. When the IC chips become denser in terms of electrical power consumption per unit volume, the heat that is generated also increases correspondingly. As the state of the art progresses, the ability to adequately dissipate heat is often a constraint on the rising complexity of package design, higher device operating speeds, and power consumption.

SUMMARY

Some embodiments of the present disclosure provide a package structure. The package structure includes a metal carrier, a conductive adhesive layer disposed on the metal carrier, a conductive post disposed on the conductive adhesive layer, a semiconductor chip disposed on the conductive adhesive layer and laterally spaced from the conductive post, and a redistribution layer disposed on the conductive post and the semiconductor chip. The semiconductor chip comprises a first terminal at an upper surface of the semiconductor chip. The first terminal of the semiconductor chip is electrically connected to the bottom surface of the semiconductor chip through the redistribution layer, the conductive post and the conductive adhesive layer.

Some embodiments of the present disclosure provide a package structure. The package structure includes first and second conductive adhesive layers, first and second conductive posts disposed on the first and second conductive adhesive layers respectively, a first semiconductor chip disposed on the first conductive adhesive layer, a second semiconductor chip disposed on the second conductive adhesive layer, a first redistribution layer disposed on the first and second conductive posts and the first and second semiconductor chips. The second conductive adhesive layer is laterally spaced from the first conductive adhesive layer. The first semiconductor chip comprises source, drain and gate terminals at an upper surface of the first semiconductor chip. The second semiconductor chip comprises source, drain and gate terminals at an upper surface of the second semiconductor chip. The source terminal of the first semiconductor chip is electrically connected to a bottom surface of the first semiconductor chip through the first redistribution layer, the first conductive post and the first conductive adhesive layer. The source terminal of the first semiconductor chip is electrically connected to the drain terminal the second semiconductor chip through the first redistribution layer.

Some embodiments of the present disclosure provide a method for fabricating a package structure. The method includes bonding a first conductive post and a first semiconductor chip, which is laterally spaced from the first conductive post, to a metal carrier through a first conductive adhesive layer, and bonding a second conductive post and a second semiconductor chip, which is laterally spaced from the second conductive post, to the metal carrier through a second conductive adhesive layer. The first conductive post comprises source, drain and gate terminals at an upper surface of the first semiconductor chip. The second conductive post comprises source, drain and gate terminals at an upper surface of the second semiconductor chip. The method also includes forming a first insulating layer on the metal carrier to encapsulate the first and second conductive posts, and the first and second semiconductor chips, and forming a redistribution layer on the first insulating layer. The source terminal of the first semiconductor chip is electrically connected to a bottom surface of the first semiconductor chip through the redistribution layer, the first conductive post and the first conductive adhesive layer. The source terminal of the first semiconductor chip is electrically connected to the drain terminal the second semiconductor chip through the redistribution layer.

The package structures of the present disclosure can be applied to various types of package structures. In order to make features and advantages of the present disclosure easy to understand, a detailed description is given in the following embodiments with reference to the accompanying drawings.

BRIEF DESCRIPTION OF THE DRAWINGS

The embodiments of the disclosure can be more fully understood by reading the subsequent detailed description and examples with references made to the accompanying drawings. For clarity of illustration, various elements in the drawings may not be drawn to scale, wherein.

DETAILED DESCRIPTION

Figure 1A:
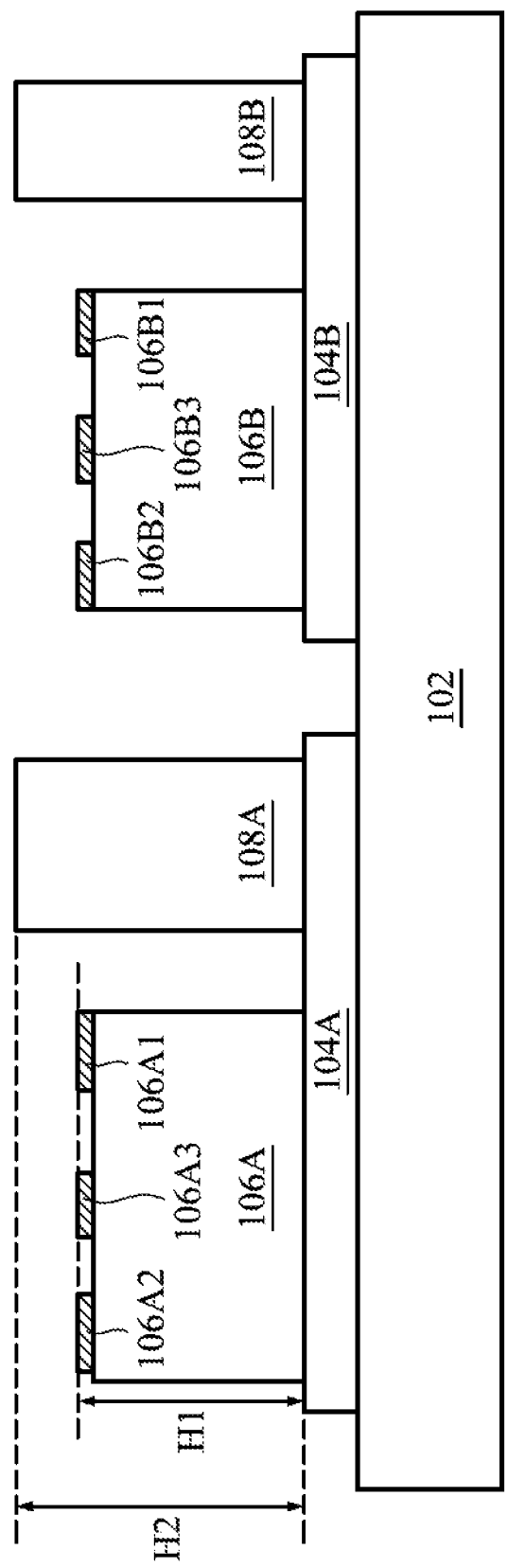
FIGS. 1A-1D illustrate cross-sectional views of forming a package structure at various intermediate stages in accordance with some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first component over or on a second component in the description that follows may include embodiments in which the first and second components are formed in direct contact, and may also include embodiments in which additional components may be formed between the first and second components, such that the first and second components may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of some embodiments are discussed below. Throughout the various views and illustrative embodiments, like reference numbers are used to designate like elements. It should be understood that additional operations can be provided before, during, and after the method, and some of the operations described can be replaced or eliminated for other embodiments of the method.

The package structures of the present disclosure utilize conductive posts and redistribution layers to form an interconnection between semiconductor chips (such as the source terminal of a semiconductor chip connected to the drain terminal of other semiconductor chip) and/or an interconnection within a single semiconductor chip (such as the backside of a semiconductor chip connected to its source terminal), resulting in the semiconductor chip packaging having high layout flexibility. Furthermore, the package structures of the present disclosure utilize metal carriers, conductive posts and redistribution layers as a heat sink to dissipate the heat generated from the semiconductor chips, which improves the performance of the semiconductor chips.

Figure 1B:
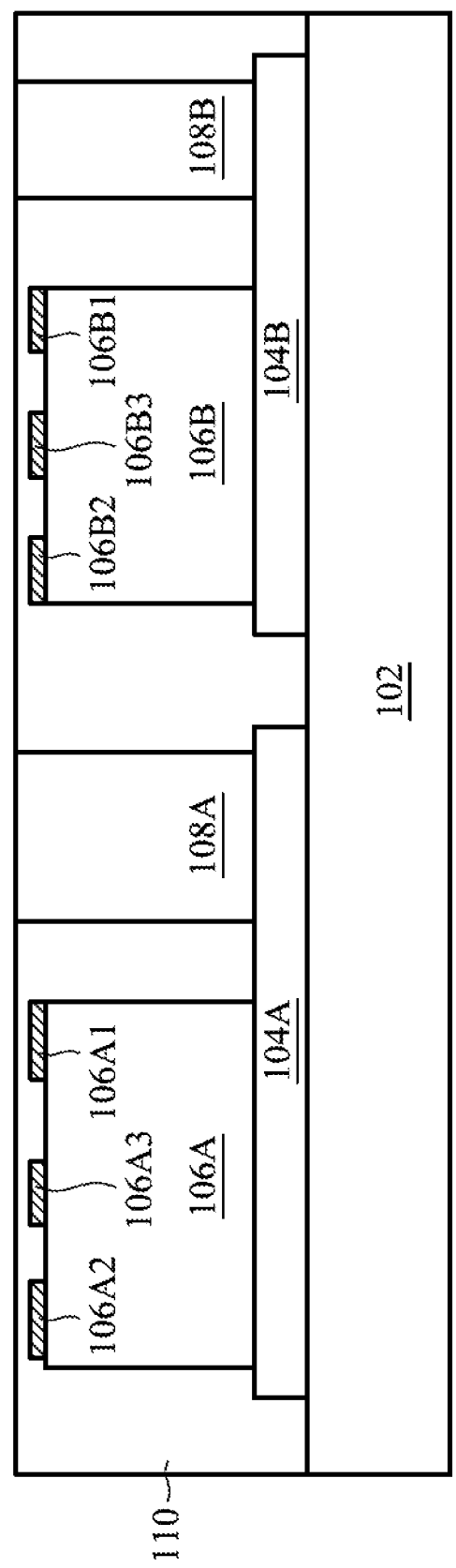
Figure 1C:
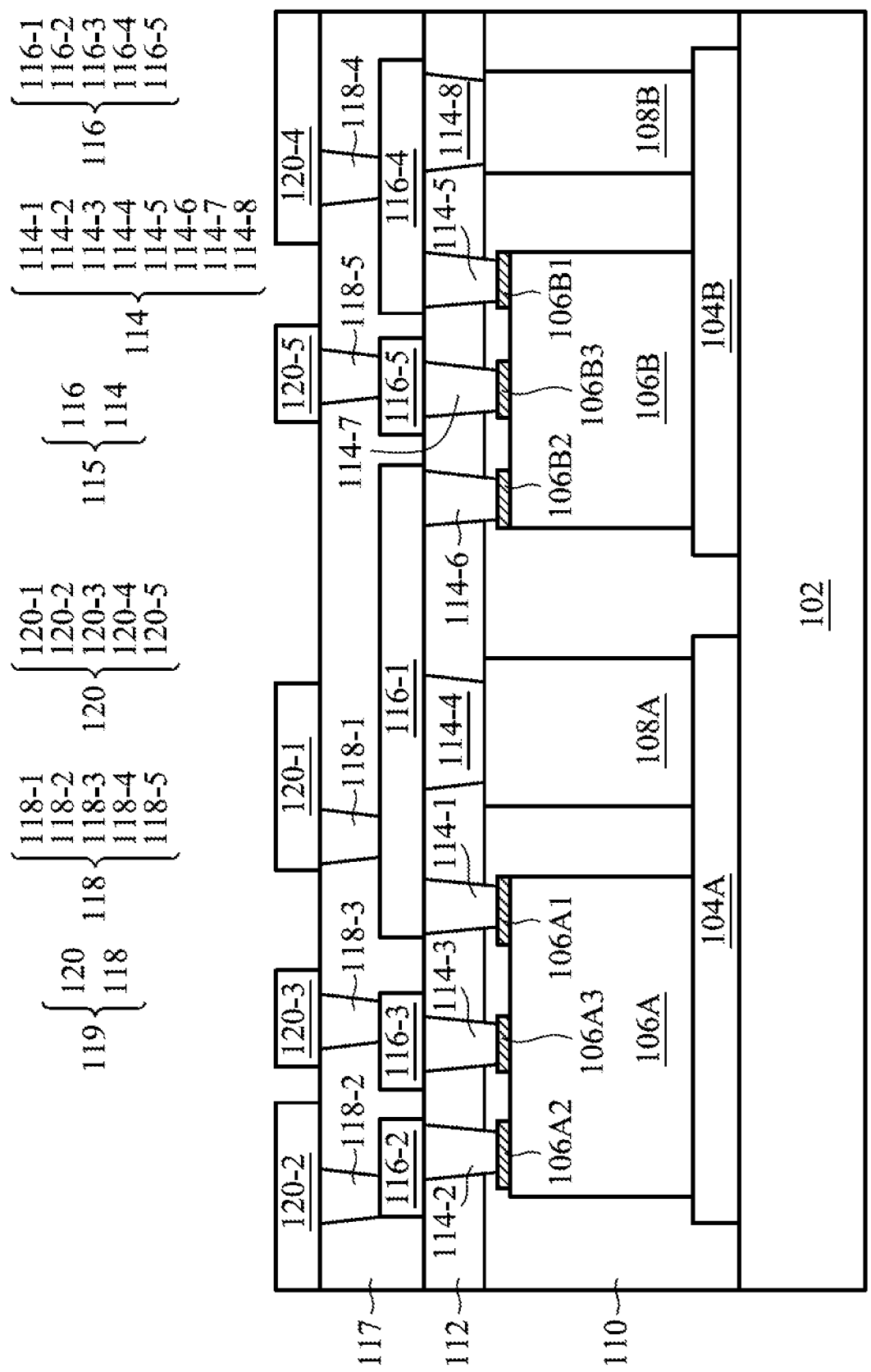
Figure 1D:
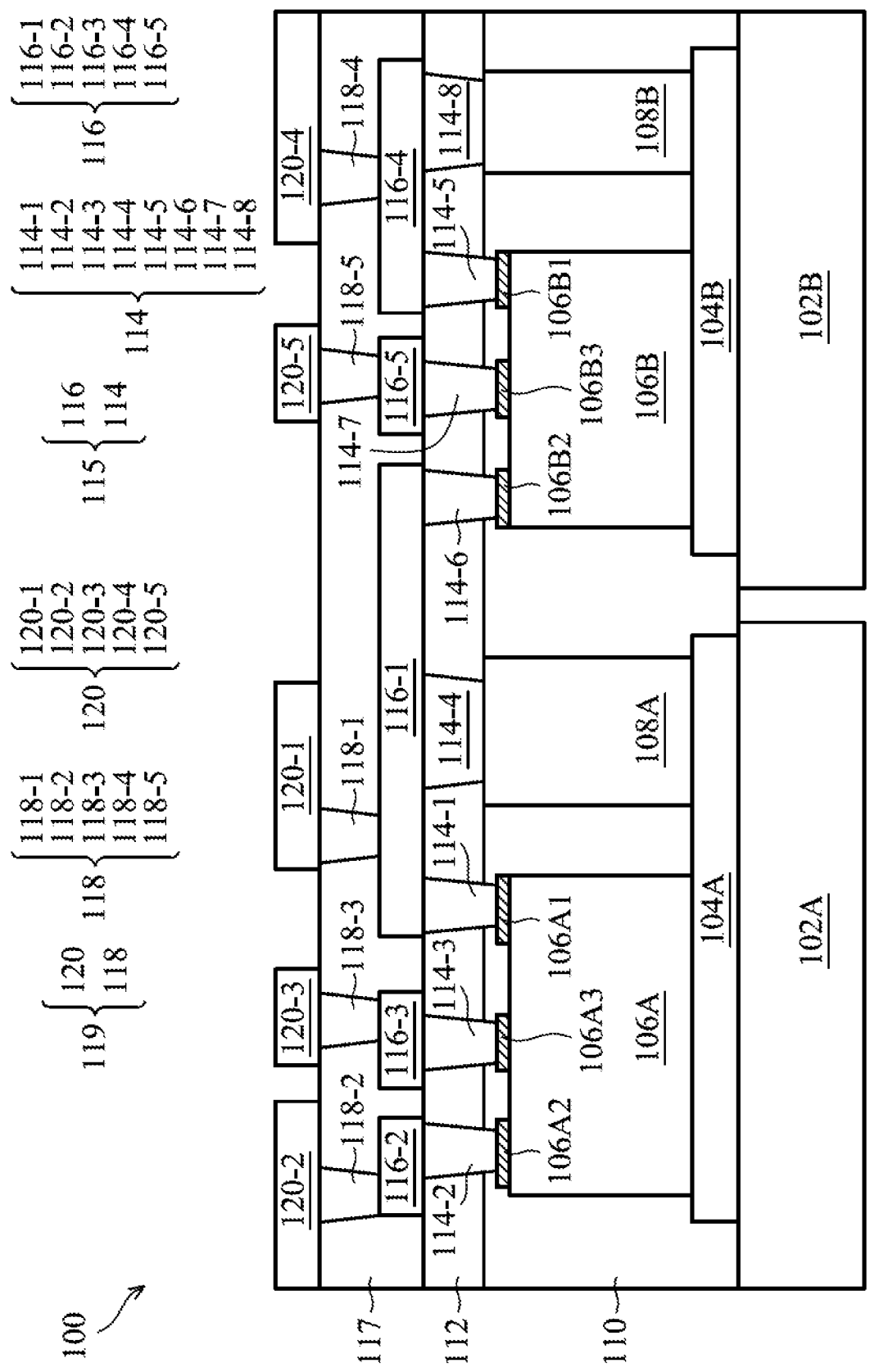

FIGS. 1A-1D illustrate cross-sectional views of forming a package structure 100 shown in FIG. 1D at various intermediate stages in accordance with some embodiments of the present disclosure. Referring to FIG. 1A, a metal carrier 102 is provided. The metal carrier 102 is also referred to as the metal substrate and supports the features formed thereon. The metal carrier 102 may be any metal carrier with high thermal conductivity. In some embodiments, the material of the metal carrier 102 may be or include stainless steel, copper (Cu), aluminum (Al), golden (Au), silver (Ag), tin (Sn), platinum (Pt), an alloy thereof, or the like. In some embodiments, the thickness of the metal carrier 102 may be in a range from about 0.1 mm to about 2 cm.

A first conductive post 108A and a first semiconductor chip 106A, which is laterally spaced from the first conductive post 108A, are bonded to the metal carrier 102 through a first conductive adhesive layer 104A. In some embodiments, the first semiconductor chip 106A may include integrated circuits, such as logic integrated circuits, analog integrated circuits, mixed signal integrated circuits, power integrated circuits, or memory circuits; micro-electro mechanical systems (MEMS); opto-electronic devices; sensors, such as light sensors or fingerprint sensor; or the like. In some embodiments, the first semiconductor chip 106A includes an active element (not shown) formed therein, such as a transistor, a metal oxide semiconductor field effect transistor (MOSFET), a metal insulator semiconductor FET (MISFET), a junction field effect transistor (JFET), an insulated gate bipolar transistor (IGBT), a combination thereof, or the like. In an embodiment, the first semiconductor chip 106A may be a power semiconductor chip which generates a lot of heat during operation. The power semiconductor chip may be or include power MISFET, power MOSFET, high electron mobility transistor (HEMT), or the like.

The first semiconductor chip 106A has terminals (also be referred to as conductive pads) at the upper surface of the first semiconductor chip 106A. The terminals include a source terminal 106A1, a drain terminal 106A2, and a gate terminal 106A3. In some embodiments, the first semiconductor chip 106A is a lateral chip and has no terminal at the bottom surface of the first semiconductor chip 106A. In other words, all of the terminals of first semiconductor chip 106A are disposed only at one of its two main surfaces, such as the upper surface of the first semiconductor chip 106A. The other main surface (bottom surface) of the first semiconductor chip 106A having no terminal is attached to the first conductive adhesive layer 104A. In an embodiment, the first semiconductor chip 106A is a lateral chip including GaN semiconductor material. The active element (not shown) of the first semiconductor chip 106A is electrically connected to the source, drain, gate terminals 106A1, 106A2 and 106A3 through interconnect structures (not shown) formed on the active element. The interconnect structures may include contact plugs formed in an interlayer dielectric (ILD) layer and/or vias and metal lines formed in inter-metal dielectric (IMD) layers. In some embodiments, the first semiconductor chip 106A has a height H1 ranging from about 50 μm to about 400 μm.

In some embodiments, the first conductive post 108A may have high electrical and thermal conductivity. The first conductive post may be referred to as a conductive sheet. In some embodiments, the material of the first conductive post 108A may be or include copper (Cu), aluminum (Al), gold (Au), silver (Si), platinum (Pt), lead (Pb), tin (Sn), an alloy thereof, a combination thereof, or the like. In some embodiments, the sidewalls of the first conductive post 108A may be perpendicular to its bottom surface, as shown in FIG. 1A. In some other embodiments, the sidewalls of the first conductive post 108A may taper from one of its main surfaces toward the other. The first conductive post 108A has a height H2 which may be equal to or greater than the height H1 of the first semiconductor chip 106A. In some embodiments, the height H2 may be in a range from about 100 μm to about 600 μm. When viewed from a top view, the first conductive post 108A may have any shape, such as round, elliptical, rectangular, polygonal, or linear profiles.

In some embodiments, the first conductive adhesive layer 104A may be a paste, a tape or a solder with good electrical conductivity. The material of the first conductive adhesive layer 104A may be Cu, Al, Au, Ag, Pt, Pb, Sn, an alloy thereof, a combination thereof, or the like. In some embodiments, the first conductive adhesive layer may be attached to the metal carrier may 102 such as by a screen printing process or a surface mount technology (SMT) or a dispensing process. Then, the first semiconductor chip 106A and the first conductive post 108A are vertically placed on the first conductive adhesive layer 104A in such a way that the bottom surfaces of the semiconductor chip 106A and the first conductive post 108A face the first conductive adhesive layer 104A. In some embodiments, the sidewalls of the first conductive post 108A are substantially perpendicular to the main surface of the metal carrier 102. For example, an extension line of a sidewall of the first conductive post 108A intersects the main surface of the metal carrier 102A at an angle ranging from about 80° to about 100°.

Still referring FIG. 1A, a second conductive post 108B and a second semiconductor chip 106B, which is laterally spaced from the second conductive post 108B, are bonded to the metal carrier 102 through a second conductive adhesive layer 104B. The second conductive adhesive layer 104B is laterally spaced from the first conductive adhesive layer 104A.

In some embodiments, the second semiconductor chip 106B may be same as or similar to the first semiconductor chip 106A as described above. For example, the second semiconductor chip 106B may be a power semiconductor chip. The second semiconductor chip 106B has a source terminal 106B1, a drain terminal 106B2, and a gate terminal 106B3 at the upper surface of the second semiconductor chip 106B. In some embodiments, the semiconductor chip 106B is a lateral chip and has no terminal at the bottom surface of the second semiconductor chip 106B. In an embodiment, the second semiconductor chip 106B is a lateral chip including GaN semiconductor material. In some embodiments, the materials and formation methods of the second conductive post 108B and the second conductive adhesive layer 104B are the same as or similar to those of the first conductive post 108A and the first conductive adhesive layer 104A described above.

Referring to FIG. 1B, a first insulating layer 110 is formed on the metal carrier 102 to encapsulate the first and second conductive adhesive layers 104A and 104B, the first and second conductive posts 108A and 108B, and the first and second semiconductor chips 106A and 106B. The first insulating layer 110 is formed to cover all surfaces of the conductive adhesive layers 104A and 104B, conductive posts 108A and 108B and the semiconductor chips 106A and 106B. The first insulating layer 110 substantially fills the gaps between the first conductive post 108A and the first semiconductor chips 106A, between the second conductive post 108B and the second semiconductor chips 106B, and between the first conductive post 108A and second semiconductor chips 106B.

In some embodiments, the material of the first insulating layer 110 may be a dielectric material such as silicon oxide or silicon nitride, a molding material; a thermoplastic material such as an epoxy resin, a silicone resin, or an acrylic resin; a thermoset material such as polyetherimide (PEI), polyether-sulfone (PES), polyphenylene-sulfide (PPS), polyamide-imide (PAI), or polyethylene-terephthalate (PET); or a laminate material such as a fiber-reinforced polymer laminate material or a fiber-reinforced polymer laminate with filler particles. In some embodiments, the first insulating layer 110 may be formed by a deposition process, a spin-on coating process, a lamination process, a molding process such as compression molding or injection molding, or the like.

Next, a planarization process such as a mechanical grinding process is performed on the first insulating layer 110. The first insulating layer 110 is thinned from its upper surface until the upper surfaces of the first and second conductive posts 108A and 108B are exposed. After the planarization process, the upper surface of the first insulating layer 110 is coplanar with the upper surfaces of the first and second conductive posts 108A and 108B. In some other embodiments, the planarization may even be stopped until the terminals 106A1, 106A2, 106A3, 106B1, 106B2 and 106B3 of the semiconductor chips 106A and 106B are exposed.

Referring to FIG. 1C, a second insulating layer 112 is formed on the upper surface of the first insulating layer 110 and covers the upper surface of the first and second conductive posts 108A and 108B. In some embodiments, the material and the formation method of the second insulating layer 112 may be the same as or similar to that of the first insulating layer 110 described above.

Next, a first redistribution layer 115 is formed on the second insulating layer 112. The first redistribution layer 115 includes a plurality of first vias 114 penetrating through the insulating layers 112 and 110 and landing on the terminals of the semiconductor chips 106A and 106B and the conductive posts 108A and 108B. The first redistribution layer 115 also includes a plurality of first traces 116 disposed on the upper surface of the second insulating layer 112 and connecting the plurality of first vias 114.

In some embodiments, the plurality of first vias 114 includes at least eight vias 114-1, 114-2, 114-3, 114-4, 114-5, 114-6, 114-7 and 114-8. The vias 114-1, 114-2 and 114-3 land on the source, drain and gate terminals 106A1, 106A2 and 106A3 of the first semiconductor chip 106A respectively; the via 114-4 lands on the first conductive post 108A; the vias 114-5, 114-6 and 114-7 land on the source, drain and gate terminals 106B1, 106B2 and 106B3 of the second semiconductor chip 106B respectively; and the via 114-8 land on the second conductive post 108B. In some embodiments, the plurality of first traces 116 includes at least five traces 116-1, 116-2, 116-3, 116-4 and 116-5 which are electrically isolated from each other. The vias 114-1, 114-4 and 114-6 are in connection with the trace 116-1. The vias 114-5 and 114-8 are in connection with the trace 116-4. The vias 114-2, 114-3 and 114-7 are in connection with the traces 116-2, 116-3 and 116-5 respectively.

In some embodiments, the material of the first redistribution layer 115 (including the plurality of first vias 114 and the plurality of first traces 116) may be or include Cu, Al, Au, Ag, Pt, Pb, Sn, an alloy thereof, a combination thereof, or the like. The steps of forming the first redistribution layer 115 may include forming via openings (not shown) which penetrate through the second insulating layer 112 and the first insulating layer 110 such as by a laser drill process to expose the terminals of the semiconductor chips 116A and 116B and the conductive posts 108A and 108B, and subsequently forming the plurality of first vias 114 in the respective via openings and the plurality of first traces 116 on the plurality of first vias 114 and the second insulating layer 112 such as by an plating, such as electroplating or electroless plating.

Still referring to FIG. 1C, a third insulating layer 117 is formed on the upper surface of the second insulating layer 112 and covers the plurality of first traces 116. In some embodiments, the material and the formation method of the third insulating layer 117 may be the same as or similar to that of the first insulating layer 110 described above.

Next, a second redistribution layer 119 is formed on the third insulating layer 117. The second redistribution layer 119 is electrically connected to the first redistribution layer 115. The second redistribution layer 119 includes a plurality of second vias 118 penetrating the third insulating layer 117 and landing on the plurality of first traces 116. The second redistribution layer 119 also includes a plurality of second traces 120 disposed on the upper surface of the third insulating layer 117 and connecting the plurality of second vias 118. In some embodiments, the plurality of second traces 120 serves as pin-outs to connect to exterior circuits (not shown).

In some embodiments, the plurality of second vias 118 includes at least five vias 118-1, 118-2, 118-3, 118-4 and 118-5 which land on the first traces 116-1, 116-2, 116-3, 116-4 and 116-5 respectively. In some embodiments, the plurality of second traces 120 includes at least five traces 120-1, 120-2, 120-3, 120-4 and 120-5 which are electrically isolated from each other. The vias 118-1, 118-2, 118-3, 118-4 and 118-5 are in connection with the traces 120-1, 120-2, 120-3, 120-4 and 120-5 respectively. In some embodiments, the materials and formation methods of the second redistribution layer 119 may be similar to those of the first redistribution layer 115 as described above.

Referring to FIG. 1D, a patterning process is performed on the metal carrier 102 to form a first metal carrier 102A and a second metal carrier 102B which is laterally spaced from the first metal carrier 102A. In some embodiments, the spacing between the first metal carrier 102A and the second metal carrier 102B is greater than about 0.2 mm. The first conductive adhesive layer 104A and the second conductive adhesive layer 104B are located on the first metal carrier 102A and the second metal carrier 104B respectively. After the patterning process, the bottom surfaces of the first and second semiconductor chips 106A and 106B are electrically isolated from each other by the first insulating layer 110. In some embodiments, the patterning process may include flipping the package structure shown in FIG. 1C up-side-down, forming a patterned mask (not shown) on the bottom surface of the metal carrier 102, etching the metal carrier 102 through the patterned mask, and remove the patterned mask such as by a wet strip or a ash process. The etching process performed on the metal carrier 102 may be a wet etching using chemistries, such as copper chloride, iron chloride, HF, NaOH, $HNO_3$, $K_3Fe(CN)_6$, KI, sulfuric acid. In some embodiments, the package structure shown in FIG. 1C may be mounted on a temporary carrier substrate before the patterning process, and the temporary carrier substrate supports the package structure during the patterning process. After the patterning process, the temporary carrier substrate may be removed. After the patterning process, a package structure 100 is produced.

In the embodiments of the present disclosure, the package structure 100 includes the first and second metal carriers 102A and 102B, the first and second conductive adhesive layers 104A and 104B, the first and second conductive posts 108A and 108B, the first and second semiconductor chips 106A and 106B, the first insulating layer, and the first redistribution layer 115.

The first and second conductive adhesive layers 104A and 104B are disposed on the first and second metal carriers 102A and 102B respectively. The second metal carriers 102B is laterally spaced from the first metal carrier 102A. The second conductive adhesive layer 104B is laterally spaced from the first conductive adhesive layer 104A by the first insulating layer 110. The first conductive post 108A and the first semiconductor chip 106A are disposed on the first conductive adhesive layer 104A, and the second conductive post 108B and the second semiconductor chip 106B are disposed on the second conductive adhesive layer 104B. The first semiconductor chip 106A includes the source, drain and gate terminals 106A1, 106A2 and 106A3 at the upper surface of the first semiconductor chip 106A. The second semiconductor chip 106B includes the source, drain and gate terminals 106B1, 106B2 and 106B3 at the upper surface of the second semiconductor chip 106B. The first insulating layer 110 encapsulates the conductive adhesive layers 104A and 104B, the conductive posts 108A and 108B, and the semiconductor chips 106A and 106B. The first redistribution layer 115 including the plurality of first vias 114 and the plurality of first traces 116 is disposed on the first insulating layer 110.

Figure 2:
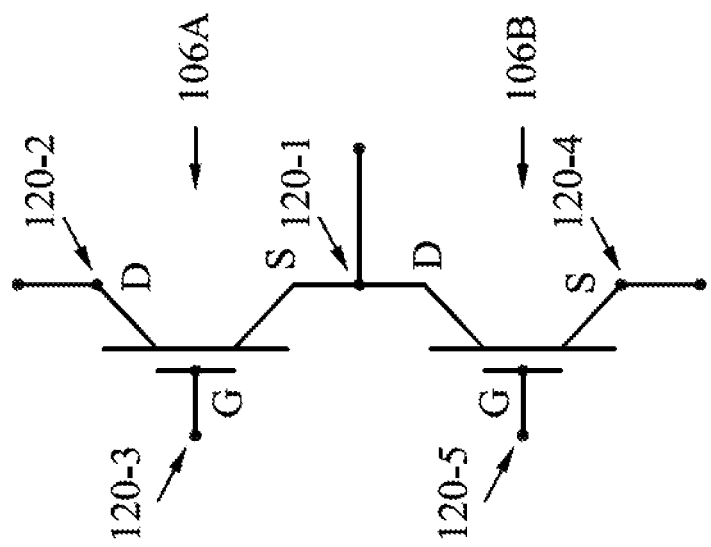
FIG. 2 is an equivalent circuit diagram of a package structure in accordance with some embodiments of the present disclosure.

The source terminal 106A1 of the first semiconductor chip 106A is electrically connected to the drain terminal 106B2 the second semiconductor chip 106B through the first redistribution layer 114, and thus the package structure 100 may include a half-bridge circuitry. A half-bridge circuitry may be converters for converting DC or AC voltages into DC voltages. Referring to FIG. 2, which is an equivalent circuit diagram of a package structure 100 in accordance with some embodiments of the present disclosure. The first semiconductor chip 106A and the second semiconductor chip 106B form a half-bridge circuitry. In some embodiments, the first semiconductor chip 106A may be a high side power switch of the half-bridge circuitry, and the second semiconductor chip 106B may be a low side power switch of the half-bridge circuitry.

Referring back to FIG. 1D, the source terminal 106A1 of the first semiconductor chip 106A is electrically connected to the bottom surface of the first semiconductor chip 106A through the first redistribution layer 115 (the vias 114-1 and 114-4 and the trace 116-1), the first conductive post 108A and the first conductive adhesive layer 104A. Thus, the source terminal 106A1 and the bottom surface of the first semiconductor chip 106A may be at equal potential. The source terminal 106B1 of the second semiconductor chip 106B is electrically connected to the bottom surface of the second semiconductor chip 106B through the first redistribution layer 115 (the via 114-5 and 114-8 and the trace 116-4), the second conductive post 108B and the second conductive adhesive layer 104B. Thus, the source terminal 106B1 and the bottom surface of the second semiconductor chip 106B may be at equal potential. The source terminal of a semiconductor chip has an equal potential to its bottom surface to improve the ability of the semiconductor chip to resist breakdown. It should be noted that the first and second metal carriers 102A and 102B are spaced from each other to prevent the source terminal 106A1 and the bottom surface of the first semiconductor chip 106A from being electrically connected to the source terminal 106B1 and the bottom surface of the second semiconductor chip 106B.

In the embodiments of the present disclosure, the metal carriers 102A and 102B with high thermal conductivity serve as a heat sink to dissipate heat generated from the semiconductor chips 106A and 106B during operation. In some embodiments, the metal carriers 102A and 102B cover equal to or greater than about 20% of the bottom surface area of the package structure 100, which enhances the ability of heat dissipation of the package structure 100.

Moreover, the semiconductor chips 106A and 106B are attached to the metal carriers 102A and 102B only through the conductive adhesive layers 104A and 104B, which enhance the ability of heat dissipation of the package structure 100.

Moreover, in the embodiments of the present disclosure, the conductive posts 108A and 108B and redistribution layers 115 and 119 may also serve as a heat sink to dissipate heat generated from the semiconductor chips 106A and 106B during operation.

The package structures of the present disclosure utilize conductive posts and redistribution layers to form an interconnection between semiconductor chips (such as the source terminal of a semiconductor chip connects to the drain terminal of other semiconductor chip) and/or an interconnection within a single semiconductor chip (such as the backside of a semiconductor chip connects to its source terminal), resulting in the semiconductor chip packaging having high layout flexibility. Furthermore, the package structures of the present disclosure utilize metal carriers, conductive posts and redistribution layers as a heat sink to dissipate the heat generated from the semiconductor chips, which improves the performance of the semiconductor chips.

Although the package structures 100 includes two semiconductor chips 106A and 106B, as shown in FIG. 1D, the package structures 100 may include one or more than two semiconductor chips and/or passive elements based on design demands.

Figure 3:
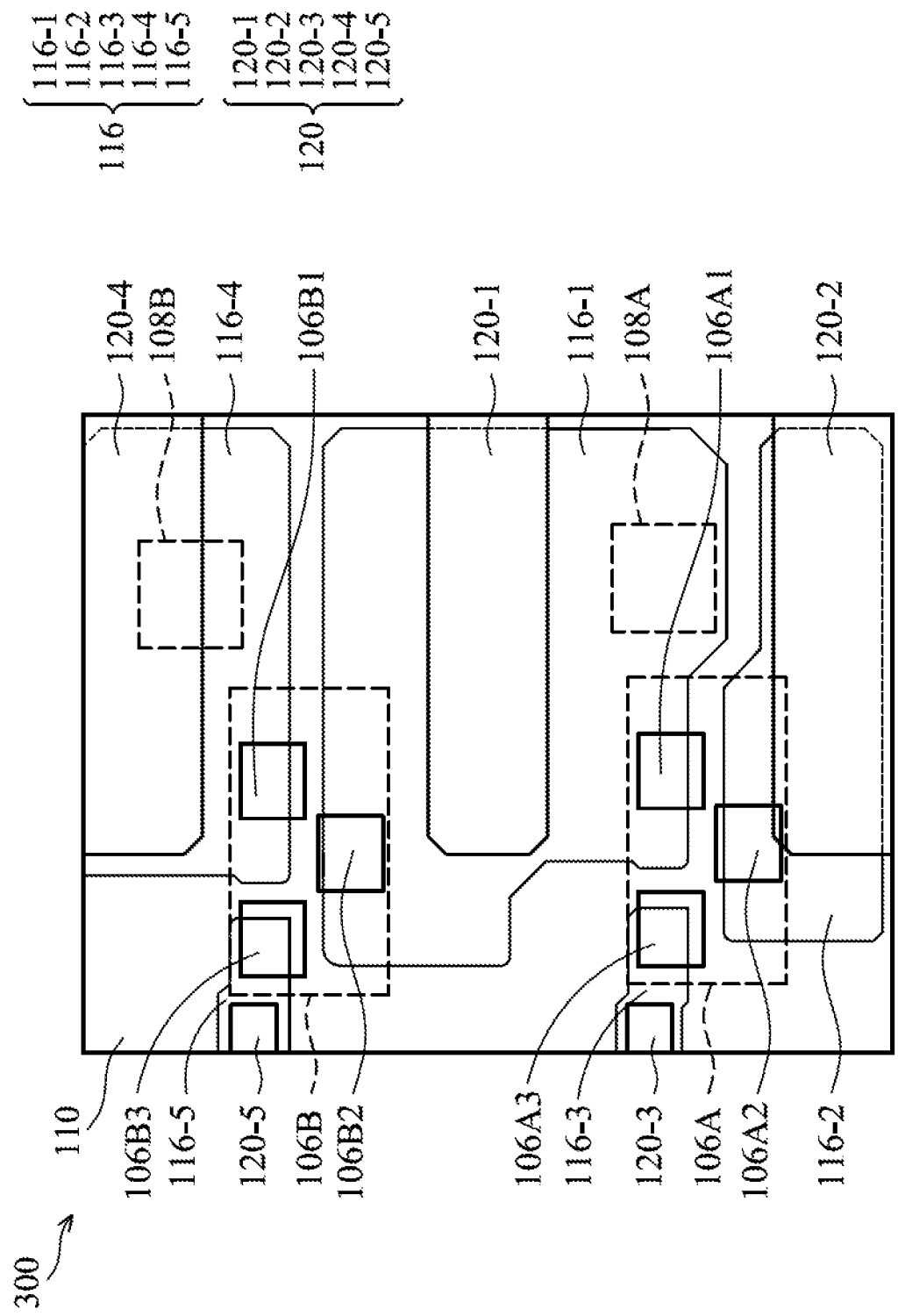
FIG. 3 is a top view of a package structure in accordance with some embodiments of the present disclosure.

FIG. 3 is a top view of a package structure 300 in accordance with some embodiments of the present disclosure. Elements or layers in FIG. 3 that are the same or similar to those in FIG. 1D are denoted by like reference numerals that have the same meaning, and the description thereof will not be repeated for the sake of brevity. The package structure 300 includes the first insulating layer 110, the first and second semiconductor chips 106B and 106A, the first and second conductive posts 108A and 108B, the plurality of first traces 116 of the first redistribution layer, and the plurality of second traces 120 of the second redistribution layer. FIG. 3 only depicts the above features for simplicity and clarity, and the package structure 300 may also include the metal carriers, the conductive adhesive layers and the plurality of vias shown in FIG. 1D.

As shown in FIG. 3, when viewed from above, the projected area of the first conductive post 108A is entirely located within the projected area of the trace 116-1, and the projected area of the second conductive post 108B is entirely located within the projected area of the trace 116-4.

As shown in FIG. 3, the plurality of first traces 116 includes the traces 116-1, 116-2, 116-3, 116-4 and 116-5 which are isolated from each other. In some embodiments, when viewed from a top view, the plurality of first traces 116 covers equal to or greater than about 50% of the projection area of the second insulating layer 117 (shown in FIG. 1D). The higher projection area of the plurality of first traces 116 results in better heat dissipation of the package structure 300.

Figure 4:
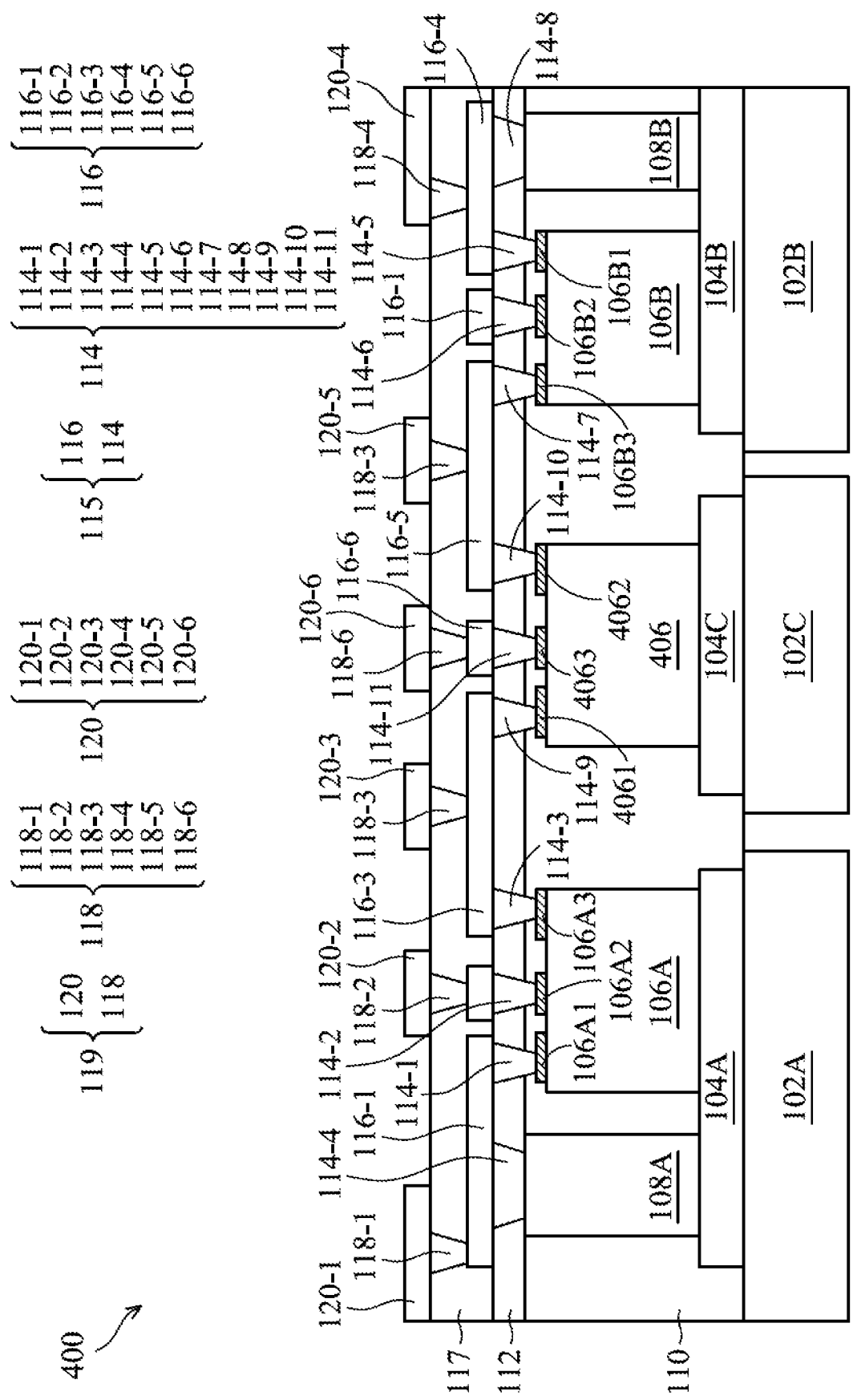
FIGS. 4, 5A and 5B are cross-sectional views of package structures in accordance with some embodiments of the present disclosure.

FIG. 4 is a cross-sectional view of a package structure 400 in accordance with some embodiments of the present disclosure. Elements or layers in FIG. 4 that are the same or similar are denoted by reference numerals like those in FIG. 1D as they have the same meaning, and the description thereof will not be repeated for the sake of brevity. The difference between the embodiments shown in FIG. 4 and FIG. 1D is that the package structure 400 further includes a third metal carrier 102C, a third conductive adhesive layer 104C disposed on the third metal carrier 102C, and a driver 406 disposed on the third conductive adhesive layer 104C.

In some embodiments, the driver 406 is bonded to the metal carrier 102 (shown in FIG. 1A) through the third conductive adhesive layer 104C. After performing the processes described above with respect to FIGS. 1A-1C, the patterning process as described above with respect to FIG. 1D is performed on the metal carrier 102 to form the third metal carrier 102C. The third metal carrier 102C is laterally spaced from the first and second metal carrier 102A and 102B. The third conductive adhesive layer 104C is laterally spaced from the first and second adhesive layers 104A and 104B. The first insulating layer 110 encapsulates the driver 406.

In some embodiments, the driver 406 is configured to provide signals to the gate terminals 106A3 and 106B3 of the first and second semiconductor chips, and may include an active element (not shown) formed therein, such as a MOSFET, a JFET, an IGBT, a transistor, a combination thereof, or the like. The driver 406 has at least three terminals 4061, 4062 and 4063. The terminals 4061 and 4062 of the driver 406 are electrically connected to the gate terminals 106A3 and 106B3 of the first and second semiconductor chips 106A and 106B through the first redistribution layer 115.

The plurality of first vias 114 also includes vias 114-9, 114-10 and 114-11 penetrating through the insulating layers 112 and 110 and respectively landing on the terminals 4061, 4062 and 4063 of the driver 406. The plurality of first traces 116 also includes a first trace 116-6 which is electrically isolated from other traces of the first traces 116. The via 114-9 is in connection with the trace 116-3 so that the terminal 4061 of the driver 406 are electrically connected to the gate terminal 106A3 of the first semiconductor chip 106A. The via 114-10 is in connection with the trace 116-5 so that the terminal 4062 of the driver 406 are electrically connected to the gate terminal 106B3 of the second semiconductor chip 106B. The via 114-11 is in connection with the trace 116-6. The plurality of second vias 118 also includes a via 118-6 penetrating through the third insulating layers 117 and landing on the traces 116-6. The plurality of second traces 120 also includes a trace 120-6 which is electrically isolated from other traces of the second traces 120. The via 118-6 is in connection with the trace 120-6. The second traces 120-6 serves as a pin-out to connect to exterior circuits (not shown).

Figure 5A:
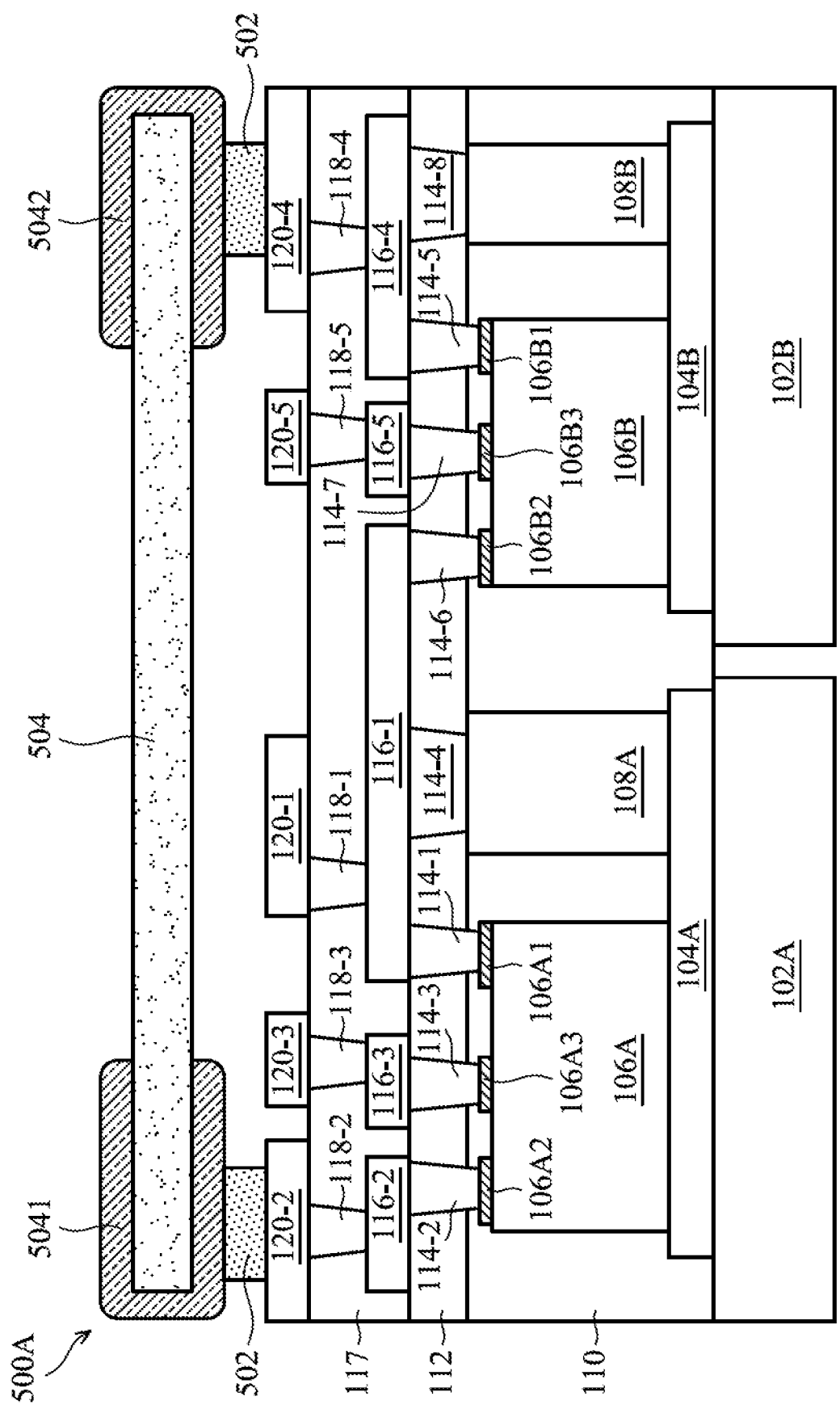

FIG. 5A is a cross-sectional view of a package structure 500A in accordance with some embodiments of the present disclosure. Elements or layers in FIG. 5A that are the same or similar to those in FIG. 1D have the same meaning and are denoted by like reference numerals, and the descriptions thereof will not be repeated for the sake of brevity. The difference between the embodiments shown in FIG. 5A and FIG. 1D is that the package structure 500A further includes a passive element 504 disposed on the second redistribution layer 120.

Referring to FIG. 5A, a passive element 504 is formed on the package structure as shown in FIG. 1D. In some embodiments, the passive element 504 may be a capacitor, an inductor, a resistor, or the like. The passive element 504 has two terminal 5041 and 5042. The terminal 5041 and 5042 of the passive element 504 are respectively bonded to the second traces 120-2 and 120-4 of the second redistribution layer 119 through fourth conductive adhesive layers 502, and thus the terminals 5041 and 5042 are electrically connected to the drain terminal 106A2 of the first semiconductor chip 106A and the source terminal 106B1 of the second semiconductor chip 106B. In some embodiments, the fourth conductive adhesive layer 502 may be a paste, a tape or a solder with good conductivity. The material of the fourth conductive adhesive layers 502 may be Cu, Al, Au, Ag, Pt, Pb, Sn, an alloy thereof, a combination thereof, or the like.

Figure 5B:
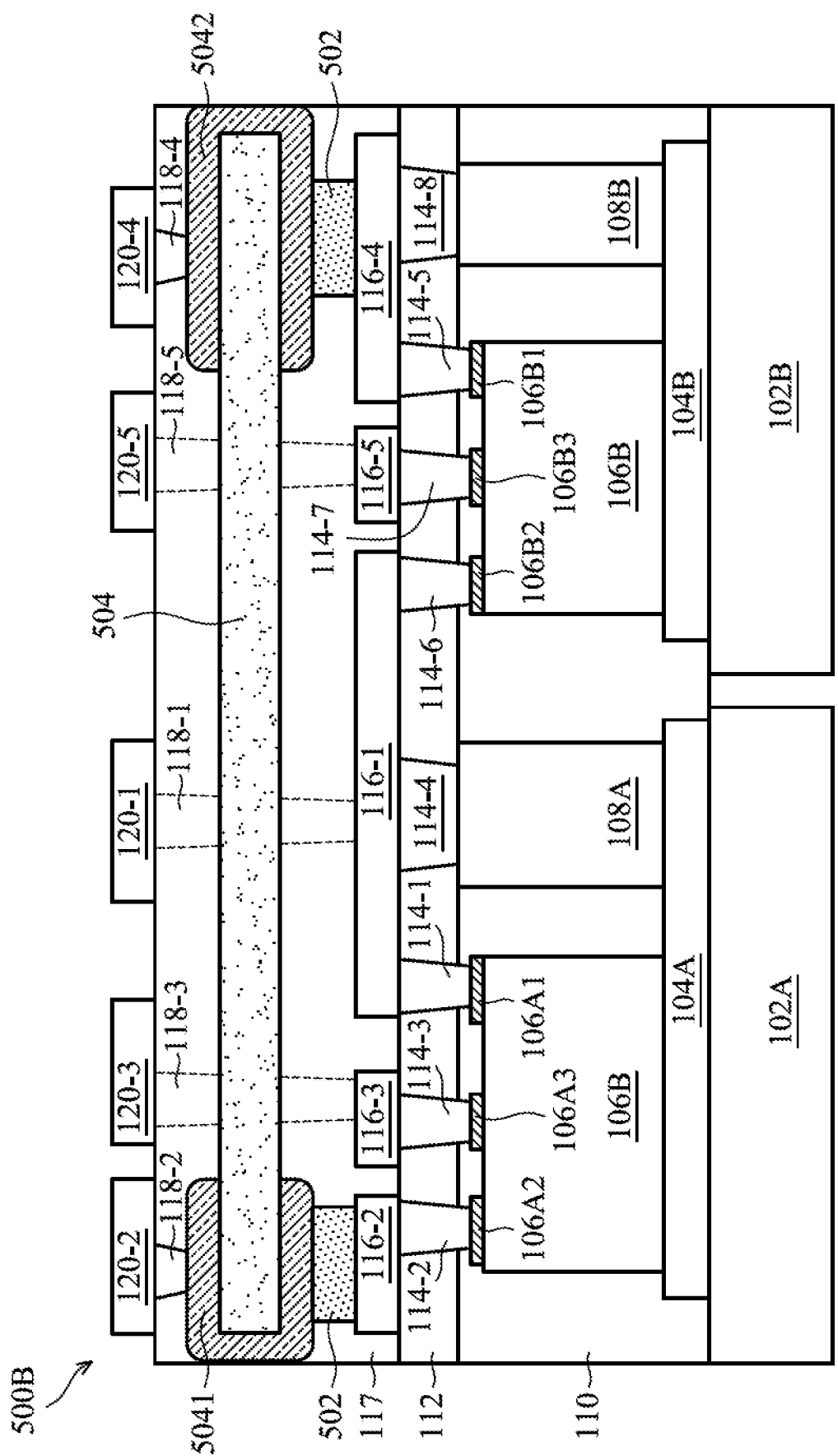

FIG. 5B is a cross-sectional view of a package structure 500B in accordance with some embodiments of the present disclosure. Elements or layers in FIG. 5B that are the same or similar to those in FIG. 5A are denoted by like reference numerals with the same meaning, and the description thereof will not be repeated for the sake of brevity. The difference between the embodiments shown in FIG. 5B and FIG. 5A is that the passive element 504 of the package structure 500B is disposed on the first redistribution layer 115 and in the third insulating layer 117.

After the first redistribution layer 115 is formed, a passive element 504 is formed on the first redistribution layer 115. The passive element 504 has two terminal 5041 and 5042 which are respectively bonded to the first traces 116-2 and 116-4 through the fourth conductive adhesive layer 502. The terminals 5041 and 5042 are electrically connected to the drain terminal 106A2 of the first semiconductor chip 106A and the source terminal 106B1 of the second semiconductor chip 106B. The third insulating layer 117 is formed to cover the passive element 504. The second vias 118-2 and 118-4 penetrate the third insulating layer 117 and respectively land on the terminal 5041 and 5042 of the passive element 504. The vias 118-1, 118-3 and 118-5 are denoted by dashed-lines to illustrate that the vias 118-1, 118-3 and 118-5 are locate behind the cross-sectional view of FIG. 5B and does not penetrate through the passive element 504.

The package structures of the present disclosure utilize conductive posts and redistribution layers to form an interconnection between semiconductor chips (such as the source terminal of a semiconductor chip connects to the drain terminal of other semiconductor chip) and/or an interconnection within a single semiconductor chip (such as the backside of a semiconductor chip connects to its source terminal), resulting in the semiconductor chip packaging having high layout flexibility. Furthermore, the package structures of the present disclosure utilize metal carriers, conductive posts and redistribution layers as a heat sink to dissipate the heat generated from the semiconductor chips, which improves the performance of the semiconductor chips.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a metal carrier;
   a conductive adhesive layer disposed on the metal carrier;
   a conductive post disposed on the conductive adhesive layer;
   a semiconductor chip disposed on the conductive adhesive layer and laterally spaced from the conductive post, wherein the semiconductor chip comprises a source terminal, a drain terminal, and a gate terminal at an upper surface of the semiconductor chip; and
   a redistribution layer disposed on the conductive post and the semiconductor chip, wherein the source terminal of the semiconductor chip is electrically connected to a bottom surface of the semiconductor chip through the redistribution layer, the conductive post and the conductive adhesive layer.

2. The package structure as claimed in claim 1, wherein the redistribution layer includes a first trace, a second trace and a third trace which are electrically isolated from each other, wherein the first trace, the second trace and the third trace are electrically connected to the source terminal, the drain terminal and the gate terminal respectively.

3. The package structure as claimed in claim 2, wherein when viewed from a top view, a projected area of the conductive post is entirely located within a projected area of the first trace of the redistribution layer.

4. The package structure as claimed in claim 1, further comprising:
   an insulating layer disposed on the metal carrier and encapsulating the conductive adhesive layer, the semiconductor chip and the conductive post, wherein the redistribution layer is disposed on the insulating layer.

5. The package structure as claimed in claim 4, wherein an upper surface of the insulating layer is coplanar with an upper surface of the conductive post.

6. The package structure as claimed in claim 1, wherein sidewalls of the conductive post are perpendicular to a main surface of the metal carrier.

7. The package structure as claimed in claim 1, wherein the semiconductor chip is a lateral chip.

8. The package structure as claimed in claim 1, wherein when viewed from a top view, the conductive post has a rectangular profile.

9. A package structure, comprising:
   first and second conductive adhesive layers, the second conductive adhesive layer being laterally spaced from the first conductive adhesive layer;
   first and second conductive posts disposed on the first and second conductive adhesive layers respectively;
   a first semiconductor chip disposed on the first conductive adhesive layer, wherein the first semiconductor chip comprises source, drain and gate terminals at an upper surface of the first semiconductor chip;
   a second semiconductor chip disposed on the second conductive adhesive layer, wherein the second semiconductor chip comprises source, drain and gate terminals at an upper surface of the second semiconductor chip; and
   a first redistribution layer disposed on the first and second conductive posts and the first and second semiconductor chips,
   wherein the source terminal of the first semiconductor chip is electrically connected to a bottom surface of the first semiconductor chip through the first redistribution layer, the first conductive post and the first conductive adhesive layer,
   wherein the source terminal of the first semiconductor chip is electrically connected to the drain terminal of the second semiconductor chip through the first redistribution layer.

10. The package structure as claimed in claim 9, further comprising:
    first and second metal carriers on which the first and second conductive adhesive layers are respectively disposed, the second metal carrier being laterally spaced from the first metal carrier.

11. The package structure as claimed in claim 9, further comprising:
    an insulating layer encapsulating the first and second conductive adhesive layers, the first and second conductive posts, and the first and second semiconductor chips, wherein the first redistribution layer is disposed on the insulating layer.

12. The package structure as claimed in claim 9, wherein the first redistribution layer comprises:
    a plurality of traces which are electrically isolated from each other, wherein the plurality of traces comprises:
    a first trace electrically connected to the source terminal of the first semiconductor chip, the first conductive post and the drain terminal of the second semiconductor chip; and
    a second trace electrically connected to the source terminal of the second semiconductor chip and the second conductive post.

13. The package structure as claimed in claim 12, further comprising:
    a second redistribution layer disposed on the first redistribution layer, wherein the second redistribution layer includes a plurality of traces, wherein each of the plurality of traces of the second redistribution layer corresponds to each of the plurality of traces of the first redistribution layer.

14. The package structure as claimed in claim 9, further comprising:
    a third conductive adhesive layer laterally spaced from the first and second adhesive layers; and
    a driver disposed on the third conductive adhesive layer, wherein the driver comprises two terminals at an upper surface of the driver,
    wherein the two terminals of the driver are electrically connected to the gate terminals of the first and second semiconductor chips respectively through the first redistribution layer.

15. The package structure as claimed in claim 9, further comprising:

a passive element disposed on the first redistribution layer, wherein the passive element comprises two terminals electrically connected to the drain terminal of the first semiconductor chip and the source terminal of the second semiconductor chip respectively.

16. A method for fabricating a package structure, comprising:
bonding a first conductive post and a first semiconductor chip, which is laterally spaced from the first conductive post, to a metal carrier through a first conductive adhesive layer, wherein the first conductive post comprises source, drain and gate terminals at an upper surface of the first semiconductor chip;
bonding a second conductive post and a second semiconductor chip, which is laterally spaced from the second conductive post, to the metal carrier through a second conductive adhesive layer, wherein the second conductive post comprises source, drain and gate terminals at an upper surface of the second semiconductor chip;
forming a first insulating layer on the metal carrier to encapsulate the first and second conductive posts, and the first and second semiconductor chips; and
forming a redistribution layer on the first insulating layer;
wherein the source terminal of the first semiconductor chip is electrically connected to a bottom surface of the first semiconductor chip through the redistribution layer, the first conductive post and the first conductive adhesive layer,
wherein the source terminal of the first semiconductor chip is electrically connected to the drain terminal of the second semiconductor chip through the redistribution layer.

17. The method as claimed in claim 16, further comprising:
performing a patterning process on the metal carrier to form a first metal carrier and a second metal carrier which are separated from each other, wherein the first and second conductive adhesive layers are located on the first and second metal carriers respectively.

18. The method as claimed in claim 16, further comprising:
before forming the redistribution layer, performing a planarization process on the first insulating layer until upper surfaces of the first and second conductive posts are exposed.

* * * * *